United States Patent
Novellini (10) Patent No.: US 8,681,919 B1
(45) Date of Patent: Mar. 25, 2014

(54) BURST PHASE DETECTION FOR PHASE CYCLIC DATA STREAMS

(75) Inventor: Paolo Novellini, Gorgonzola (IT)

(73) Assignee: Xilinx, Inc., San Jose, CA (US)

( * ) Notice: Subject to any disclaimer, the term of this patent is extended or adjusted under 35 U.S.C. 154(b) by 494 days.

(21) Appl. No.: 13/111,868

(22) Filed: May 19, 2011

(51) Int. Cl.
*H03D 3/24* (2006.01)
*H03L 7/08* (2006.01)

(52) U.S. Cl.
USPC .......................... 375/376; 375/371; 327/156

(58) Field of Classification Search
USPC .......... 375/355, 371, 373, 376; 327/147, 156; 331/25, 1 R
See application file for complete search history.

(56) References Cited

U.S. PATENT DOCUMENTS

| | | | |
|---|---|---|---|
| 4,600,889 A * | 7/1986 | Rugen | 375/376 |
| 2008/0075221 A1 * | 3/2008 | Lai | 375/376 |
| 2008/0124092 A1 | 5/2008 | Dvir et al. | |

OTHER PUBLICATIONS

Maxim Integrated Products: Data Sheet MAX3634, "622Mbps/1244Mbps Burst-Mode Clock Phase Aligner for GPON OLT Applications", pp. 1-8, 19-3818; Rev 0; Sep. 2005, Sunnyvale, CA USA.

* cited by examiner

*Primary Examiner* — Betsy Deppe
(74) *Attorney, Agent, or Firm* — Kevin T. Cuenot (57) ABSTRACT

A phase detection system can include a phase detector configured to determine a phase difference between a data stream and a first control signal and a numerically controlled oscillator configured to generate the first control signal responsive to a second control signal. The system can include a memory device having memory cells correlated with a cycle of the data stream. The memory device can be configured to increment the current memory cell according to a clock signal synchronized with the data stream. The system also can include an attenuator configured to attenuate the phase difference and generate an attenuated phase difference and an adder. The adder can be coupled to the memory device and be configured to generate a first sum of the attenuated phase difference and a value read from a current memory cell of the plurality of memory cells.

20 Claims, 7 Drawing Sheets

| | | | | | | | | | | |
|---|---|---|---|---|---|---|---|---|---|---|
| 1 | 0.00 | 0.00 | 0.00 | 0.00 | 0.00 | 0.00 | 0.00 | 0.00 | 0.00 | 0.00 |
| 2 | 10.00 | 3.00 | 3.00 | 3.00 | 3.00 | 3.00 | 3.00 | 3.00 | 3.00 | 10.00 |
| 3 | 19.00 | 5.70 | 5.70 | 5.70 | 5.70 | 5.70 | 5.70 | 5.70 | 5.70 | 19.00 |
| 4 | 27.10 | 8.13 | 8.13 | 8.13 | 8.13 | 8.13 | 8.13 | 8.13 | 8.13 | 27.10 |
| 5 | 34.39 | 10.32 | 10.32 | 10.32 | 10.32 | 10.32 | 10.32 | 10.32 | 10.32 | 34.39 |
| 6 | 40.95 | 12.29 | 12.29 | 12.29 | 12.29 | 12.29 | 12.29 | 12.29 | 12.29 | 40.95 |
| 7 | 46.86 | 14.06 | 14.06 | 14.06 | 14.06 | 14.06 | 14.06 | 14.06 | 14.06 | 46.86 |
| 8 | 52.17 | 15.65 | 15.65 | 15.65 | 15.65 | 15.65 | 15.65 | 15.65 | 15.65 | 52.17 |
| 9 | 56.95 | 17.09 | 17.09 | 17.09 | 17.09 | 17.09 | 17.09 | 17.09 | 17.09 | 56.95 |
| 10 | 61.26 | 18.38 | 18.38 | 18.38 | 18.38 | 18.38 | 18.38 | 18.38 | 18.38 | 61.26 |
| 11 | 65.13 | 19.54 | 19.54 | 19.54 | 19.54 | 19.54 | 19.54 | 19.54 | 19.54 | 65.13 |
| 12 | 68.62 | 20.59 | 20.59 | 20.59 | 20.59 | 20.59 | 20.59 | 20.59 | 20.59 | 68.62 |
| 13 | 71.76 | 21.53 | 21.53 | 21.53 | 21.53 | 21.53 | 21.53 | 21.53 | 21.53 | 71.76 |
| 14 | 74.58 | 22.37 | 22.37 | 22.37 | 22.37 | 22.37 | 22.37 | 22.37 | 22.37 | 74.58 |
| 15 | 77.12 | 23.14 | 23.14 | 23.14 | 23.14 | 23.14 | 23.14 | 23.14 | 23.14 | 77.12 |
| 16 | 79.41 | 23.82 | 23.82 | 23.82 | 23.82 | 23.82 | 23.82 | 23.82 | 23.82 | 79.41 |

| | | | | | | | | | | | | | |
|---|---|---|---|---|---|---|---|---|---|---|---|---|---|
| N-15 | 99.98 | 29.99 | 29.99 | 29.99 | 29.99 | 29.99 | 29.99 | 29.99 | 29.99 | 29.99 | 29.99 | 99.98 | 99.98 |
| N-14 | 99.98 | 29.99 | 29.99 | 29.99 | 29.99 | 29.99 | 29.99 | 29.99 | 29.99 | 29.99 | 29.99 | 99.98 | 99.98 |
| N-13 | 99.98 | 29.99 | 29.99 | 29.99 | 29.99 | 29.99 | 29.99 | 29.99 | 29.99 | 29.99 | 29.99 | 99.98 | 99.98 |
| N-12 | 99.98 | 29.99 | 29.99 | 29.99 | 29.99 | 29.99 | 29.99 | 29.99 | 29.99 | 29.99 | 29.99 | 99.98 | 99.98 |
| N-11 | 99.98 | 30.00 | 30.00 | 30.00 | 30.00 | 30.00 | 30.00 | 30.00 | 30.00 | 30.00 | 30.00 | 99.98 | 99.98 |
| N-10 | 99.99 | 30.00 | 30.00 | 30.00 | 30.00 | 30.00 | 30.00 | 30.00 | 30.00 | 30.00 | 30.00 | 99.99 | 99.99 |
| N-9 | 99.99 | 30.00 | 30.00 | 30.00 | 30.00 | 30.00 | 30.00 | 30.00 | 30.00 | 30.00 | 30.00 | 99.99 | 99.99 |
| N-8 | 99.99 | 30.00 | 30.00 | 30.00 | 30.00 | 30.00 | 30.00 | 30.00 | 30.00 | 30.00 | 30.00 | 99.99 | 99.99 |
| N-7 | 99.99 | 30.00 | 30.00 | 30.00 | 30.00 | 30.00 | 30.00 | 30.00 | 30.00 | 30.00 | 30.00 | 99.99 | 99.99 |
| N-6 | 99.99 | 30.00 | 30.00 | 30.00 | 30.00 | 30.00 | 30.00 | 30.00 | 30.00 | 30.00 | 30.00 | 99.99 | 99.99 |
| N-5 | 99.99 | 30.00 | 30.00 | 30.00 | 30.00 | 30.00 | 30.00 | 30.00 | 30.00 | 30.00 | 30.00 | 99.99 | 99.99 |
| N-4 | 99.99 | 30.00 | 30.00 | 30.00 | 30.00 | 30.00 | 30.00 | 30.00 | 30.00 | 30.00 | 30.00 | 99.99 | 99.99 |
| N-3 | 99.99 | 30.00 | 30.00 | 30.00 | 30.00 | 30.00 | 30.00 | 30.00 | 30.00 | 30.00 | 30.00 | 99.99 | 99.99 |
| N-2 | 99.99 | 30.00 | 30.00 | 30.00 | 30.00 | 30.00 | 30.00 | 30.00 | 30.00 | 30.00 | 30.00 | 99.99 | 99.99 |
| N-1 | 99.99 | 30.00 | 30.00 | 30.00 | 30.00 | 30.00 | 30.00 | 30.00 | 30.00 | 30.00 | 30.00 | 99.99 | 99.99 |
| N | 100.00 | 30.00 | 30.00 | 30.00 | 30.00 | 30.00 | 30.00 | 30.00 | 30.00 | 30.00 | 30.00 | 100.00 | 100.00 |

BURST PHASE DETECTION FOR PHASE CYCLIC DATA STREAMS

FIELD OF THE INVENTION

One or more embodiments disclosed within this specification relate to phase detection. More particularly, one or more embodiments relate to phase detection for use in burst applications or so called burst phase detection.

BACKGROUND

Within modern communication systems, phase detection is an important aspect of recovering data from received data streams. Typically, a phase locked loop (PLL) type of circuit design is utilized to generate an output signal having a phase that is related to the phase of an incoming data stream. The output signal generated by the PLL or other functionally equivalent or similar circuit such as a Numerically Controlled Oscillator (NCO) can be used to synchronize data recovery units and/or clock units with the incoming data stream. Once synchronization is achieved, data within the incoming data stream can be recovered or extracted.

Burst phase detectors refer to a type of phase detector that can be used to extract data from a data stream that exhibits large swings in the phase of the data that is begin transmitted. A given data stream, for example, can include data from two or more different transmitting units, each sending data with a very different phase. As a result, the receiving unit sees an incoming data stream with data that appears to exhibit substantially instantaneous changes in the phase of the data, e.g., between the end of data from one transmitting unit and the beginning of data from another transmitting unit. Modern phase detection systems must be able to adjust for these large swings in phase to properly extract data from the received data stream.

SUMMARY

One or more embodiments disclosed within this specification relate to phase detection and, more particularly, to phase detection for use in burst applications or so called burst phase detection.

An embodiment can include a phase detection system. The system can include a phase detector configured to determine a phase difference between a data stream and a first control signal. The system can include a numerically controlled oscillator (NCO) configured to generate the first control signal responsive to a second control signal. The system can include a memory device having one or more memory cells correlated with a cycle of the data stream. The memory device can be configured to increment a current memory cell according to a clock signal synchronized with the data stream. The system also can include an attenuator configured to attenuate the phase difference and generate an attenuated phase difference. The system further can include a first adder coupled to the memory device that is configured to generate a first sum of the attenuated phase difference and a value read from the current memory cell according to a clock signal synchronized with the data stream. The first adder can be configured to store the first sum in the current memory cell.

Another embodiment can include a method of phase detection. The method can include determining a phase difference between a data stream and a control signal, attenuating the phase difference generating an attenuated phase difference, and determining a current sum of a value read from a current memory cell of a plurality of memory cells and the attenuated phase difference. The method further can include controlling an NCO configured to generate the control signal responsive to the value read from the current memory cell and storing the current sum in the current memory cell.

Another embodiment can include a device. The device can include a non-transitory data storage medium usable by a system having a processor and a memory. The data storage medium can store program code that, when executed by the system, causes the system to perform phase detection, the data storage medium can include computer-usable program code configured to determine a phase difference between a data stream and a control signal, computer-usable program code configured to attenuate the phase difference generating an attenuated phase difference, and computer-usable program code configured to determine a current sum of a value read from a current memory cell of a plurality of memory cells and the attenuated phase difference. The data storage medium also can include computer-usable program code configured to control an NCO configured to generate the control signal responsive to the value read from the current memory cell and computer-usable program code configured to store the current sum in the current memory cell.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to phase detection and, more particularly, to phase detection for use in burst applications. A receiving unit can be configured to perform burst phase detection to decode data sent by multiple transmitting units over a shared communication medium. Each time one transmitting unit stops sending data and a different transmitting unit begins sending data, the receiving unit must determine the phase of the data being sent.

The receiving unit can be configured to determine a phase profile corresponding to each of the various transmitting units sending data to the receiving unit. In doing so, the receiving unit can utilize the entirety of the data being sent by each transmitting unit as opposed to being limited, for example, to determining phase using only the preamble portion of data sent by each respective transmitting unit. The receiving unit can rely upon the cyclicity of the received data stream for phase acquisition and high jitter tolerance. Further, the receiving unit can be configured to determine phase using techniques that allow the receiving unit to adjust dynamically to changing numbers of transmission units within the system.

Figures 1, 2:
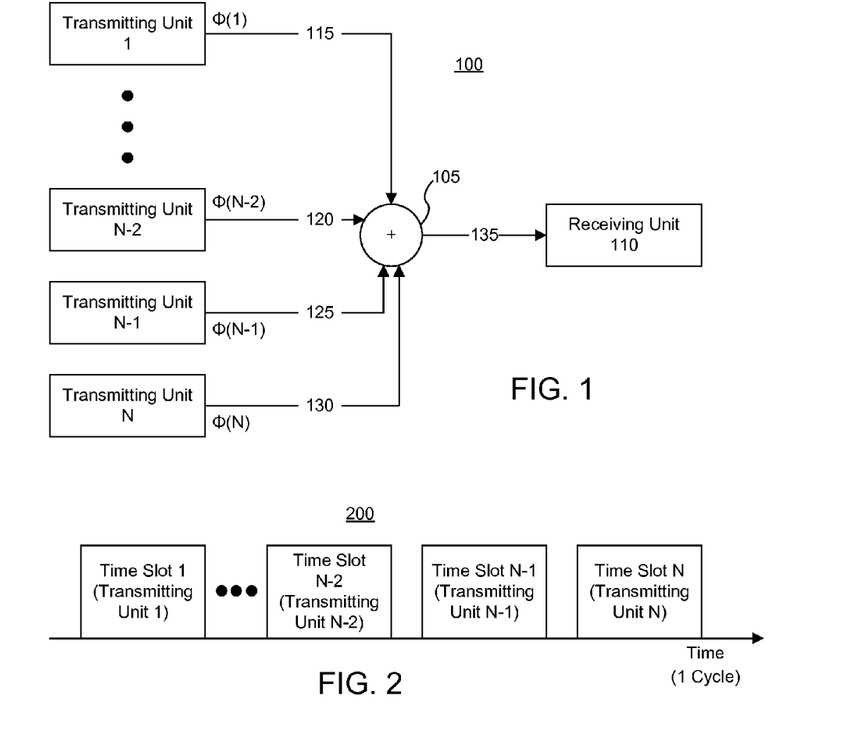
FIG. 1 is a first block diagram illustrating a system including multiple transmitting units communicating with a receiving unit over a shared communication medium in accordance with an embodiment disclosed within this specification.
FIG. 2 is a first signal diagram illustrating a cycle of a data stream to be processed by a receiving unit in accordance with another embodiment disclosed within this specification.

FIG. 1 is a first block diagram illustrating a system 100 including multiple transmitting units communicating with a receiving unit over a shared communication medium in accordance with an embodiment disclosed within this specification. As shown, system 100 can include a plurality of transmitting units numbered 1 through N, where "N" is an integer value greater than 1. Each of the transmitting units 1 to N is configured to communicate with receiving unit 110 over a shared communication medium. More particularly, each of transmitting units 1 to N can send a data stream 115-130 respectively to an adder unit 105. An adder 105 can combine, e.g., sum, data streams 115-130 received from each of transmitting units 1 to N respectively and provide the resulting data stream 135 to receiving unit 110.

In an exemplary illustration, each of transmitting units 1 to N can be located at various field offices that are part of a telephony system. Receiving unit 110 can be part of the same telephony system and can be located at a centralized telephony office. For example, transmitting units 1 to N can communicate with receiving unit 110 using a Gigabit Passive Optical Network (GPON) as defined in ITU-T G.984. Continuing with the illustration, each of transmitting units 1 to N can communicate on a same frequency, e.g., a same optical wavelength in the case of GPON.

It should be appreciated that the example presented within this specification is for purposes of illustration only and is not intended as a limitation of the one or more embodiments disclosed herein. For example, the particular protocol used can vary according to the particular communication application. Further, the particular communication medium used, e.g., optical fiber, cable, whether wireless or wire-line, is not intended as a limitation of the one or more embodiments disclosed within this specification.

Though using a same frequency or wavelength (hereafter collectively referred to as "frequency"), each of transmitting units 1 to N can occupy a particular portion of time referred to as a "time slot" in the shared communication medium. Using time slots, transmitting units 1 to N do not transmit data that overlaps in time with one another. Rather, each of transmitting units 1 to N is assigned a unique time slot within which to transmit data. Thus, multiple transmitting units 1 to N transmit data from left to right, e.g., to receiving unit 110.

Each of transmitting units 1 to N also can receive data from receiving unit 110. The particular order of transmission for transmitting units 1 to N, e.g., the particular ordering of time slots allocated to each of transmitting units 1 to N, can be controlled or determined by receiving unit 110. Receiving unit 110 can communicate to each respective transmitting unit 1 to N with instructions as to when to transmit data, e.g., when the time slot for that particular transmitting unit occurs. The frequency of operation of each of transmitting units 1 to N, for example, can be extracted by each respective one of transmitting units 1 to N from communications sent by receiving unit 110 to one or more or all of transmitting units 1 to N.

Accordingly, receiving unit 110 knows a priori the particular, and same, frequency used by each of transmitting units 1 to N to communicate. Receiving unit 110, however, must determine the particular phase of the data sent by each of transmitting units 1 to N in the time slot occupied by that transmitting unit in order to decode or extract data from data stream 135. The phase of the data sent by each of transmitting units 1 to N can vary for a variety of different reasons. These reasons can include, for example, but are not limited to, the distance over which data is sent from the transmitting unit to receiving unit 110 or adder 105, temperature variation in the environment and/or communication medium or components, or the like.

In this regard, since each transmitting unit 1 to N is not at a same location, appreciably the phase of the data sent by each of transmitting units 1 to N will vary as the distance between each respective transmitting unit 1 to N and either adder 105 or receiving unit 110 is different. Thus, as pictured in FIG. 1, the phase of data sent by transmitting unit 1 is represented as $\phi(1)$. The phase of data sent by transmitting unit N-2 is represented as $\phi(N-2)$. The phase of data sent by transmitting unit N-1 is represented as $\phi(N-1)$. The phase of data sent by transmitting unit N is represented as $\phi(N)$.

In order to extract data from data stream 135, receiving unit 110 must be phase aligned with the data. More particularly, receiving unit 110 must be phase aligned with each portion of data sent by, e.g., time slot corresponding to, each of transmitting units 1 to N. The phase detection performed by receiving unit 110, in general, phase aligns receiving unit 110 so that data stream 135 is sampled within the middle of the "eye" of the data for each of transmitting units 1 to N. For example, receiving unit 110 phase aligns itself with data stream 135 so that sampling of the bits contained within data stream 135 occurs at approximately a midpoint between the two edges of the signal that define the particular bit being sampled.

FIG. 2 is a first signal diagram 200 illustrating a cycle of a data stream that can be processed by a receiving unit in accordance with another embodiment disclosed within this specification. Signal diagram 200 illustrates an example of one cycle of data stream 135 that is provided to receiving unit 110 of FIG. 1. One cycle, in general, represents an amount of time or a portion of data stream 135 during, or within, which data from each of transmitting units 1 to N is sent. Like numbers will be used to refer to the same items throughout this specification.

One cycle, for example, includes one time slot for each of transmitting units 1 to N. As noted, the time slots have a defined order that can remain constant from one cycle to the next. One exception would be the case where the number of transmitting units changes, e.g., one or more transmitting units are removed or one or more transmitting units are added. Since each time slot is associated with a particular one of transmitting units 1 to N, the time slot ordering corresponds to, e.g., is the same as, the transmission order of transmission units 1 to N.

Signal diagram 200 illustrates an example of the ordering of time slots 1 to N corresponding to respective ones of transmitting units 1 to N. Each of transmitting units 1 to N can be configured to send data during the time slot correlated, or associated, with that transmitting unit. As noted, the order can be established, and is therefore known, by receiving unit 110.

Figure 3:
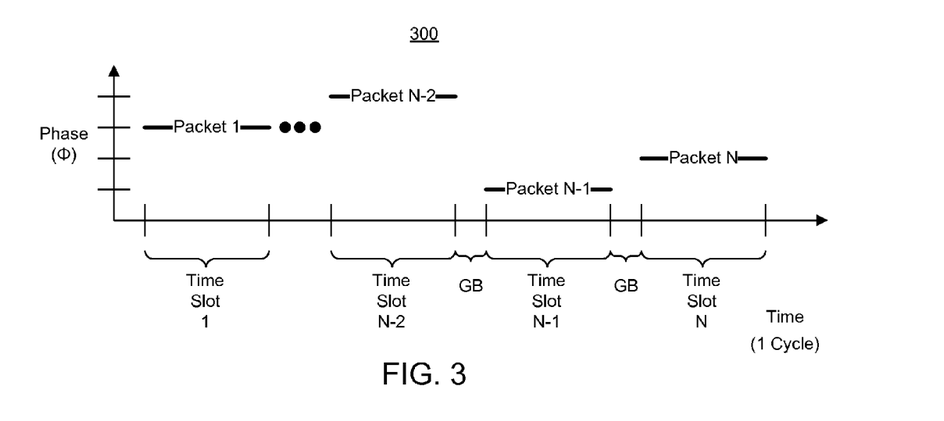
FIG. 3 is a second signal diagram illustrating a cycle of a data stream to be processed by a receiving unit in accordance with another embodiment disclosed within this specification.

FIG. 3 is a second signal diagram 300 illustrating one cycle of a data stream to be processed by a receiving unit in accordance with another embodiment disclosed within this specification. More particularly, signal diagram 300 illustrates another aspect of data stream 135 and the cycle illustrated in FIG. 2. In this regard, signal diagram 300 is time aligned with signal diagram 200. Time is demarcated on the horizontal axis. Signal diagram 300 further illustrates that each of the portions of data sent by transmitting units 1 to N has a different phase, which is demarcated on the vertical axis.

As noted, one "cycle" of the data stream can represent a portion of the data stream that includes one time slot for each of transmitting units 1 to N. Within the time span of one cycle, each transmitting unit 1 to N has the opportunity to send data during the time slot allocated to that particular transmitting unit. A cycle further can include a guard band denoted as "GB" in FIG. 3 that is positioned between consecutive or adjacent time slots. An additional guard band can be positioned between time slot N and time slot 1 when beginning a new cycle.

For purposes of illustration and description, the portion of data sent by each respective one of transmitting units 1 to N during the time slot allocated to that transmitting unit can be called a "packet." It should be appreciated that each portion of data, i.e., packet, sent by a same transmitting unit within different cycles can be sized the same or sized differently. Further, packets sent by different transmitting units within a same cycle can be sized the same or sized differently. In any case, the size of the packet sent by a transmitting unit cannot exceed the size of the time slot allocated to that transmitting unit.

Signal diagram 300 illustrates that transmitting unit 1 is sending packet 1 during time slot 1. Transmitting unit N-2 is sending packet N-2 during time slot N-2. Transmitting unit N-1 is sending packet N-1 during time slot N-1. Transmitting unit N is sending packet N during time slot N.

Figure 4:
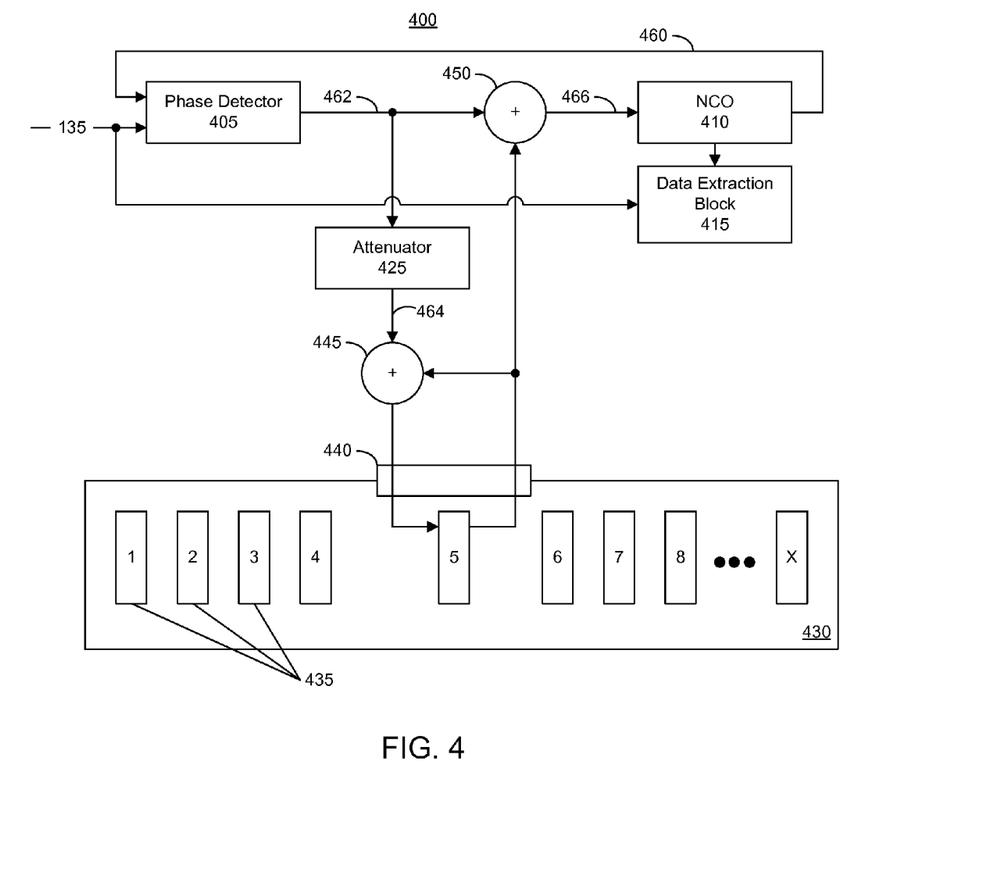
FIG. 4 is a second block diagram illustrating a system for burst phase detection in accordance with another embodiment disclosed within this specification.

FIG. 4 is a second block diagram illustrating a system 400 for burst phase detection in accordance with another embodiment disclosed within this specification. System 400 can be included, for example, within a receiving unit such as receiving unit 110 illustrated with reference to FIG. 1. The various blocks pictured in FIG. 4 can be implemented in circuitry whether using discrete components, devices implemented within an integrated circuit, or a combination of both. Accordingly, system 400 can process data stream 135. Data stream 135 can include one or more cycles as described with reference to FIGS. 2-3 of this specification.

In general, system 400 cyclically scans packets sent from each transmitting unit over time. System 400 can estimate the phase of each bit or group of bits transmitted as part of data stream 135 over time from all transmitting units by profiling the phase of a full cycle rather than estimating the phase of each packet sent from each transmitting unit using preamble bits typically included within each respective packet. Phase information from consecutive cycles can be analyzed. The phase profile that is determined can be stored in a local memory and updated over time to track phase variations due to factors such as temperature, the addition of one or more new transmitting units, or the removal of one or more transmitting units.

As shown, system 400 can include a phase detector 405 that receives data stream 135 and first control signal 460 that is output from a numerically controlled oscillator (NCO) 410. Phase detector 405 can determine the phase difference between data stream 135 and first control signal 460. The phase difference can be output from phase detector 405 in the form of phase difference signal 462.

The output of phase detector 405 can be coupled to an input of an attenuator 425. Attenuator 425 can attenuate or reduce the value of phase difference signal 462. For example, attenuator 425 can be implemented as a divider circuit that divides phase difference signal 462 by a selected divisor. Attenuator 425 can output an attenuated phase difference signal 464 and provide attenuated phase difference signal 464 to an input of a first adder 445.

A memory device 430 can include a plurality of memory cells 435. For purposes of illustration, each of memory cells 435 is labeled as 1-X, where X represents an integer value greater than one and, in this example, greater than eight. In this regard, each of memory cells 435 can be referenced as a group or can be individually reference as 435_1, 435_2, etc. Each of memory cells 435 can be read from, or written to, via an interface 440 that can be implemented as part of memory device 430. For example, interface 440 of memory device 430 can include a write port and a read port. Adder 445, for example, can access the write port of interface 440 to write values generated by adder 445 to selected memory cells 435. The read port of interface 440 can be coupled to adder 445 and to a second adder 450 to provide values stored in a selected one of memory cells 435 to each of adders 445 and 450.

Memory device 430 can be configured so that each of memory cells 435 stores a value generated by adder 445 for a given clock cycle in relation to data stream 135. For each cycle of data stream 135, a sum generated by adder 445 for the cycle is stored in memory cell 435_1 and the last value is stored by adder 445 in memory cell 435_X. Beginning with the next cycle of data stream 135, memory cells 435_1-435_X are overwritten.

For example, consider the case in which the cycle of data stream 135 is 2 seconds and the frequency of the clock, and thus data stream 135, is 100 MHz. The number of memory cells 435, e.g., memory locations for storing data or words, can be determined by dividing the cycle time of 2 seconds by 10 nanoseconds, e.g., the period the clock given the frequency of 100 MHz. This calculation results in memory device 430 sized at 0.2 gigabytes or 200 megabytes.

Adder 445 can determine a sum, referred to as a first sum, of attenuated difference signal 464 and the value read from a current memory cell, which in this example is memory cell 435_5, of memory device 430. The value read from current memory cell 435_5 also can be provided to an input of adder 450. Adder 445 can sum attenuated difference signal 464 with the value read from current memory cell 435_5 of memory device 430. The first sum generated by adder 445 is stored within memory device 430 in current memory cell 435_5 thereby overwriting the value initially read.

The particular memory cell 435 to which data is written and from which data is read can be determined or synchronized with a frequency of a clock signal synchronized with data stream 135. For each bit, or group of bits, of data stream 135, phase detector 405 can generate phase difference signal 462, which is attenuated by attenuator 425 to generate attenuated phase difference signal 464, which is provided to adder 445, which generates a first sum that is stored within the current memory cell 435. For the next bit, or group of bits, of data stream 135, the process can repeat with the current memory cell 435 being memory cell 435_6, etc.

For example, interface 440 can be clocked using the clock signal that is synchronized with data stream 135. Interface 440 can control the read and write addresses for the ports so that on each clock cycle, and thus bit, or group of bits, of data stream 135, the particular memory cell considered to be the current memory cell is advanced by one. When the current memory cell is 435_X and the address is advanced, the address of the current memory cell can rollover to 435_1.

Because each transmitting unit occupies a particular time slot of the cycle, phase error values corresponding to each transmitting unit will be stored within memory cells 435. For example, consider a system where two transmitting units are sending data of approximately equal length and within time slots of approximately equal duration and the memory device includes 512 memory cells. In that case, memory cells 0-255 will store values calculated by operating upon the packet sent by the first transmitting unit. Memory cells 256-511 will store values calculated by operating upon the packet sent by the second transmitting unit. In general, groupings of memory cells 435 can correspond to the time slots illustrated with reference to FIGS. 2 and 3.

By storing values generated from data stream 135 over the span of memory cells 435 for only a single cycle, when a new cycle starts, the prior values are overwritten. Referring to the prior example, during the first cycle, memory cells 0-255 store consecutively calculated phase error values determined from a first packet sent by transmitting unit 1. Also during the first cycle, memory cells 256-511 store consecutively calculated phase error values determined from the first packet sent by transmitting unit 2. During the second cycle, memory cells 0-255 store consecutively calculated phase error values determined from the second packet sent by transmitting unit 1. Also during the second cycle, memory cells 256-511 store consecutively calculated phase error values determined from the second packet sent by transmitting unit 2. Thus, each of memory cells 435 stores a value that is determined from the same bit position of a cycle and derived from a same transmitting unit from one cycle to the next.

Referring again to FIG. 4 and, in particular to memory cell 435_5, the value that is added to attenuated phase difference signal 464 by adder 445 is the value stored within memory cell 435_5. Thus, the first sum generated by adder 445 during the prior cycle that is stored within memory cell 435_5 is read from current memory cell 435_5 and added to attenuated phase difference signal 464. The resulting sum is stored, thereby overwriting the prior stored value, in current memory cell 435_5.

As noted, because the current memory cell advances with the clock signal synchronized with data stream 135, memory cell 435_5, for example, continues to store values derived from the same transmitting unit and values derived from the same position of the time slot for that transmitting unit presuming the number of transmitting units sending packets within data stream 135 remains constant. Thus, memory cell 435_5, over time, is a type of average of the values from one cycle to the next for one particular transmitting unit and, moreover, for the same relative point within the time slot of that transmitting unit. The same is true of each of memory cells 435.

The sum read from current memory cell 435_5, e.g., the first sum from the prior cycle, in addition to being provided to adder 445, is also provided to an input of adder 450. Adder 450 can be configured to sum phase difference signal 462 from phase detector 405 with the value read from current memory cell 435_5 from the prior cycle. The resulting sum, e.g., the second sum, is provided to an input of NCO 410 as a second control signal 466. NCO 410 generates first control signal 460 responsive to second control signal 466. In this example, second control signal 466, as noted, is the sum of phase difference signal 462 and the first sum stored in current memory cell 435_5 from the prior cycle (prior to being overwritten by adder 445).

As shown, NCO 410 can output an additional signal to data extraction block 415. The additional signal can specify the current phase of NCO 410 as specified responsive to second control signal 466. In an embodiment, control signal 466 can be the same as the additional signal provided to data extraction block 415. In any case, data extraction block 415 can receive data stream 135. Data extraction block 415 optionally can buffer data stream 135 and use phase information received from NCO 410 to extract data from data stream 135, which then can be output.

System 400 determines phase, in effect, by averaging data using different packets in time from the same transmitting unit. System 400 acquires or estimates phase by averaging phase information from different bits from the same transmitting unit in different packets cyclically rather than averaging phase information from consecutive bits in the same cycle only. Averaging phase information cyclically offers several benefits not found within conventional systems.

In one aspect, because the phase estimation is based on the phase information of many bits of the same transmitting unit from different packets over multiple cycles (e.g., as opposed to using only preamble bits in other conventional techniques), the number of bits in the preamble that may be required for phase sampling within the receiving unit to stabilize can be reduced to as low as zero bits. Such is the case as the techniques illustrated within this specification are agnostic as to whether bits of a packet are from a preamble of the packet or are actual data bits of the packet when estimating phase. As a consequence, the preamble can have a length of zero leading to a potential bandwidth utilization ratio of one.

The treatment of preamble bits and data bits being equivalent, in reference to the agnosticism of system 400, means that system 400 is effectively protocol agnostic since no differentiation and/or interpretation of preamble bits from data bits for packets is performed. Moreover, the use of the entirety of data packets means that system 400 can be minimally affected by preambles that are corrupted with noise. Unlike other burst phase detection systems, data can be extracted from the data stream despite the corruption of preambles.

In operation, consider an example in which data stream 135 includes data from two different transmitting units, e.g., unit 1 and unit 2. Unit 1 can transmit data with a phase of 30 degrees. Unit 2 can transmit data with a phase of 100 degrees. Unit 1 can send packets of approximately 1 second in length, whereas unit 2 can send packets of approximately 1 microsecond in length. Further, for purposes of discussion, a conventional system that utilizes preambles for burst phase alignment may require approximately 10 microseconds to achieve phase lock.

In the case of a conventional burst phase detector using preambles for phase detection, when the first packet from unit 1, e.g., packet 1, is received, the first 10 microseconds of packet 1 are lost while phase lock is acquired. Subsequently while still in the first cycle, the conventional system begins to receive data corresponding to packet 2 from unit 2. Since acquiring phase lock takes 10 microseconds and packet 2 is only 1 microsecond, packet 2 ends prior to the conventional system acquiring phase lock. The entirety of packet 2 is lost.

The one or more embodiments disclosed within this specification allow a particular amount of packet loss in the first cycle or cycles to acquire phase lock in a protocol agnostic manner. Once phase lock is acquired, however, packet loss during other portions, e.g., in the middle or end portions, of data stream 135, is minimized if not eliminated. By comparison, the example illustrated for the conventional burst phase detectors that rely upon preambles may be more likely to lose phase lock even after lock is acquired thereby increasing the odds of further packet loss in middle portions of data stream 135 where such loss is more noticeable.

Referring to FIG. 4, system 400 can begin receiving a first cycle of data stream 135. Memory cells 435 of memory device 430 can be initialized to store values of 0. Further, NCO 410 can begin operation outputting first control signal 460 indicating an initial phase of 0 degrees. When packet 1 is received, NCO 410 can begin to adjust phase. A fraction of the phase error that is determined can be stored in memory device 430.

For example, referring to packet 1, phase detector 405 initially computes a phase difference as indicated by phase difference signal 462 of 30 degrees, e.g., the difference between the 30 degree phase of packet 1 and the initial phase of 0 degrees specified by first control signal 460. Because memory device 430 is initialized to store 0 values in each of memory cells 435, the contribution from memory device 430, e.g., value read from the current memory cell, to each of adders 445 and 450 during the first cycle will be 0. Accordingly, second control signal 466, during the first cycle, is equivalent to phase difference signal 462.

Presuming that attenuator 425 is configured to output a signal that specifies a result of the input being divided by a selected divisor such as 10 in this example, e.g., a divide by 10 circuit, a value of 3 corresponding to 3 degrees, e.g., 30 divided by 10, is provided to adder 445 as attenuated phase difference signal 464. For purposes of illustration, the current memory cell will be memory cell 435_1 in this example. Adder 445 can add attenuated phase difference signal 464 specifying a value of 3 with the value of 0 read from current memory cell 435_1. Adder 445 can store the value of 3 as the first sum within current memory cell 435_1, thereby overwriting the 0 value initially stored therein. Accordingly, during the next cycle, e.g., the second cycle, the contribution read from memory cell 435_1 and provided to each of adders 445 and 450 will be 3.

Over time, in view of the 1 second duration of packet 1 in the first cycle, system 400 may acquire phase lock and values of 30 are stored in memory cells of memory device 430 corresponding to packet 1 of the first cycle. More particularly, the value of 3 is stored in memory cell 435_1 and the values begin to increase for the remaining memory cells 435 that correspond to packet 1 of the first cycle eventually converging to 30. Over subsequent cycles, values stored in memory device 430 converge to 30 in each of the memory cells corresponding to the first packet. In that case, first control signal 460 of NCO 410 indicates a phase of 30 degrees resulting in phase difference signal 462, being 0, summed with the correct phase of 30 stored as part of a phase profile in memory device 430 to be provided to NCO 410.

Subsequently, within the first cycle, system 400 begins receiving data corresponding to packet 2 from unit 2. As noted, the phase of packet 2 is 100 degrees. Phase detector 405 outputs phase difference signal 462 specifying a value of 70 degrees, which is calculated by subtracting 30 degrees as indicated by first control signal 460 from the 100 degree phase of the incoming data of data stream 135. Since acquiring phase lock takes 10 microseconds and packet 2 is only 1 microsecond, packet 2 ends prior to system 400 acquiring phase lock. For example, NCO 410 may have only incre-mented so that first control signal 460 indicates a phase of approximately 33 degrees (up from the 30 degree starting point) when packet 2 ends.

Attenuator 425 generates attenuated phase difference signal 464 specifying a value of 7 degrees. Again, the initial contribution of memory device 430 to adder 445 is 0, resulting in a value of 7 degrees being stored in the current memory location, which is another one of memory cells 435 to the right of memory cell 435_1. By the end of packet 2 during cycle 1, system 400 will have reached a phase of approximately 33 degrees and be ahead of the 30 degree phase of packet 1 of the next cycle, i.e., cycle 2. Due to the short duration of packet 2, the values stored in memory cells 435 that correspond to packet 2 in the first cycle do not converge from 7 to 100, but rather end at a point or value between 7 and 100.

System 400 then can begin to receive packet 1 of cycle 2. Phase detector 405 can generate phase difference signal 462 specifying negative 3 (−3) degrees, which is determined as the difference between the 30 degree phase of packet 1 of cycle 2 in data stream 135 and the 33 degree phase indicated by first control signal 460. Attenuator 425 generates attenuated phase difference signal 464 specifying a value of −0.3. Adder 445 sums attenuated phase difference signal 464 with the value of 3 degrees stored in what is again current memory cell 435_1 to generate a first sum of 2.7 degrees which is overwritten to current memory cell 435_1. While the value of 2.7 degrees is stored in current memory cell 435_1 thereby overwriting the value of 3 from the prior cycle, the value of 3 from that prior cycle has already been provided to both adders 445 (as illustrated) and also to adder 450. Thus, second control signal 466 specifies a value of phase difference signal 462 plus the value of 3 read from current memory cell 435_1 prior to being overwritten. The phase error, which becomes an average phase error accounting for variability in phase from different factors such as temperature, is added to phase difference signal 462 to generate second control signal 466.

Over time, system 400 converges to phase lock over all packets in data stream 135. Values stored in memory device 430 represent the phase of packets of a cycle, e.g., a phase profile. The prior stored phase values are provided to adder 450 and summed with phase difference signal 462 to generate second control signal 466 to NCO 410.

After some number of cycles, the content of memory device 430 converges to a phase profile of the full cycle. System 400, for example, can store a representation of the phase profile as a derivative. Thus, at each clock cycle, e.g., for each bit, system 400 reads a current memory cell 435 and changes the phase used for data extraction accordingly. When no phase variations occur due to temperature, the phase error read from memory device 430 will a representation of the correct phase for each packet even in the presence of bursts resulting in data stream 135 being sampled in the "eye" of the data despite any phase jump between adjacent packets.

Attenuator 425 helps to ensure that the contents stored in memory device 430 converge to the phase profile over multiple cycles and, in doing so, render system 400 less sensitive to noise during the phase estimation process. Within a conventional burst phase detector, noise can cause loss of phase lock. Attenuator 425, however, reduces the impact of noise allowing system 400 to continue to track by incrementally adjusting the phase profile from one cycle to the next.

Figure 5:
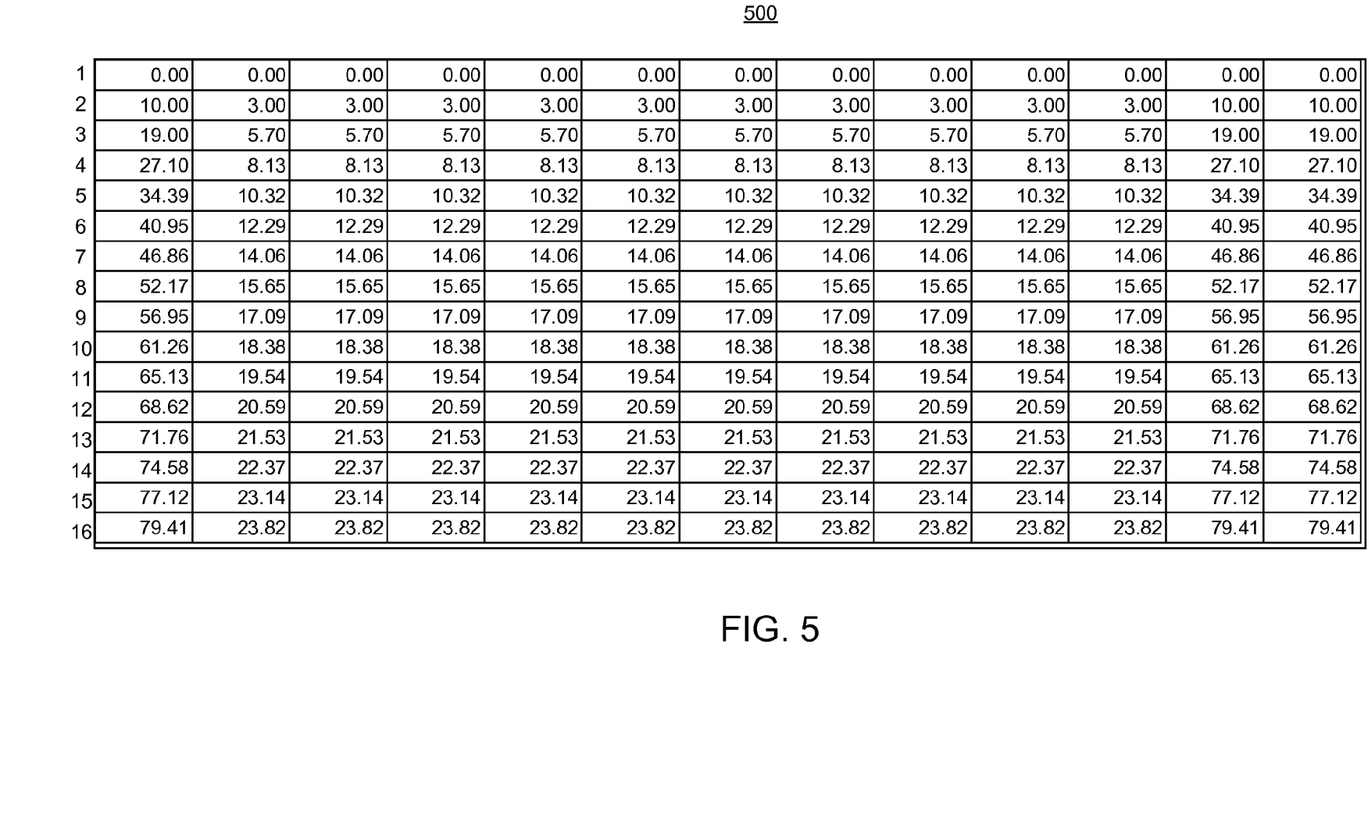
FIGS. 5 and 6, taken collectively, form a table illustrating the determination of a phase profile in accordance with another embodiment disclosed within this specification.
Figure 6:
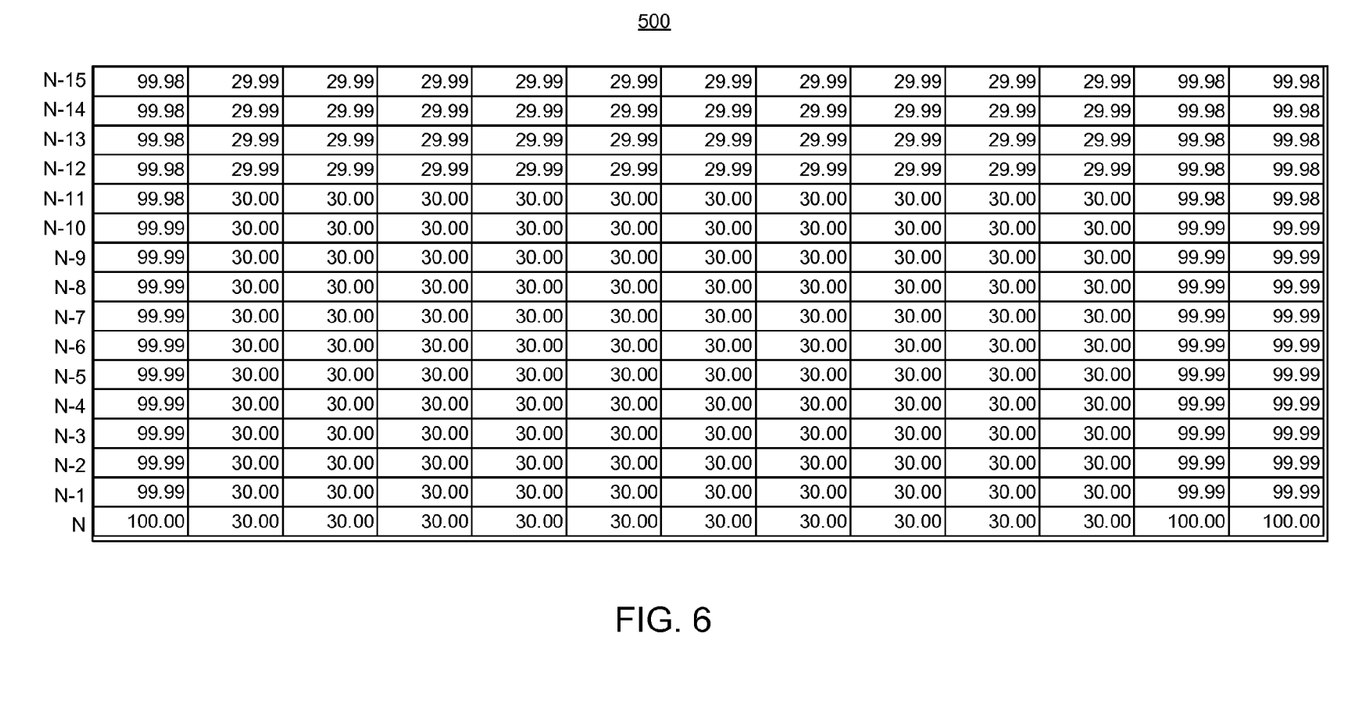

FIGS. 5 and 6, taken collectively, form a table 500 illustrating the determination of a phase profile in accordance with another embodiment disclosed within this specification. FIGS. 5 and 6 illustrate the state of an exemplary memory device in which each cell of a row in table 500 corresponds to a memory cell. Each row corresponds to a different cycle of the data stream being processed. The data illustrated in FIG. 5, for example, illustrates in row 1 that each memory cell begins the process by storing an initialized value of 0.

In general, FIGS. 5 and 6 can represent values derived using the prior example in which two transmitting units are sending data with respective phases of 30 degrees and 100 degrees. The illustrative example described with reference to FIG. 4 was shown to converge in fewer cycles. Referring to FIGS. 5 and 6, more cycles are illustrated to better show the convergence and determination of the phase profile as stored in the memory device.

In an embodiment illustrated in FIGS. 5 and 6, memory cells of the memory device can be seeded with initial values. In the example presented in FIG. 5, the memory cells are seeded with values corresponding to a percentage, i.e., 10 percent in this case, of the phase offset of each transmitting unit. Thus, memory cells are seeded with values of 3 and 10 respectively.

As each cycle is processed, the phase profile continues to evolve. Continuing from FIG. 5 to FIG. 6, presuming further cycles are processed (not shown), it can be seen that the phase profile illustrated in row N of FIG. 6 has converged to the correct phase profile. The correct phase profile is determined without regard for preamble bits or the particular protocol that is used.

It should be appreciated that in memory cells corresponding to a lack of packets, e.g., when one or more transmitting units are removed and memory cells remain allocated for the now unoccupied time slots, the one or more embodiments disclosed herein still converge to a phase profile. In one aspect, the phase of the prior or previous transmitting unit can be presumed in the absence of another transmitting unit that has been removed. In another aspect, a phase of zero can be presumed.

Figure 7:
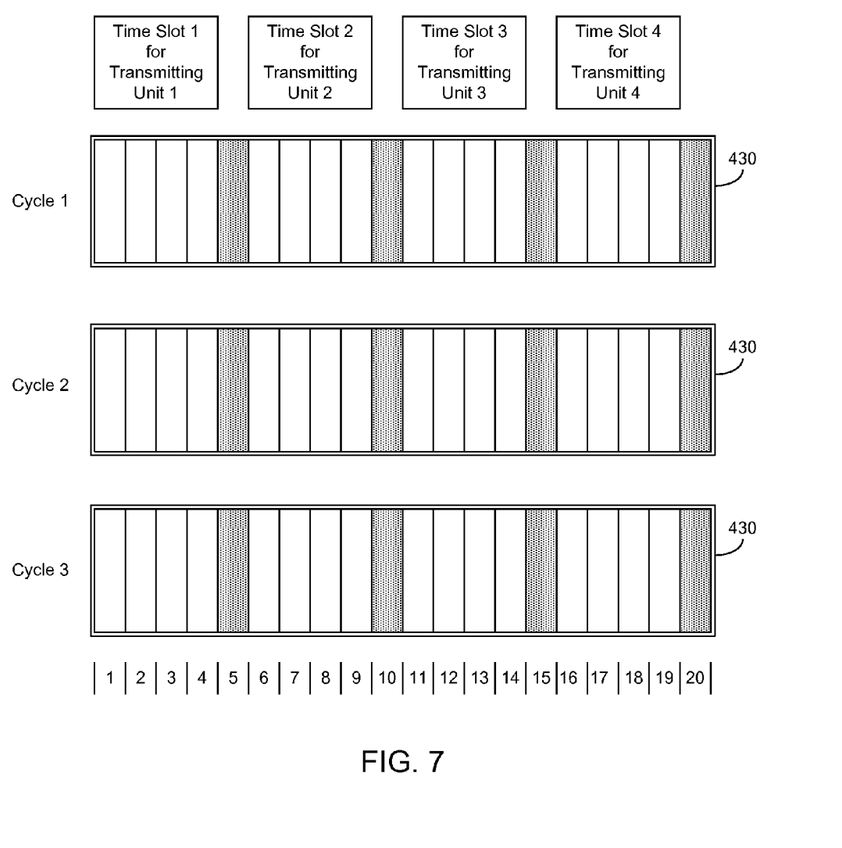
FIG. 7 is a second block diagram illustrating memory management in accordance with another embodiment disclosed within this specification.

FIG. 7 is a second block diagram illustrating memory management in accordance with another embodiment disclosed within this specification. FIG. 7, for example, illustrates how memory cells of memory device 435 can be aligned with the same time slots, and thus, the same transmitting units, over time. FIG. 7 illustrates that the same memory cells over time store values corresponding to the same relative locations within the same time slots from one cycle to the next. Some of the memory cells, e.g., those that are shown as being shaded, will store values corresponding to the guard band over time.

For example, over the three cycles shown, memory cells 1-4 store phase profile values corresponding to time slot 1 for transmitting unit 1. Memory cells 6-9 store phase profile values corresponding to time slot 2 for transmitting unit 2. Memory cells 11-14 store phase profile values corresponding to time slot 3 for transmitting unit 3. Memory cells 16-20 store phase values corresponding to time slot 4 for transmitting unit 4. Memory cells 5, 10, 15, and 20 store values that are derived with the guard band between consecutive ones of the time slots and, thus, packets.

The configuration shown further illustrates that if one or more transmitting units are removed or added, the phase profile stored within memory device 430 adapts over time without any adjustments being made to the system. The memory cells of memory device 430 automatically begin to re-align with the new time slot and transmitting unit ordering over time.

The example illustrated in FIG. 7 presumes that each time slot is of equal duration. As discussed, this need not be the case. Each time slot can be of a particular duration that need not be equal to each other or any other time slot of a cycle.

Figure 8:
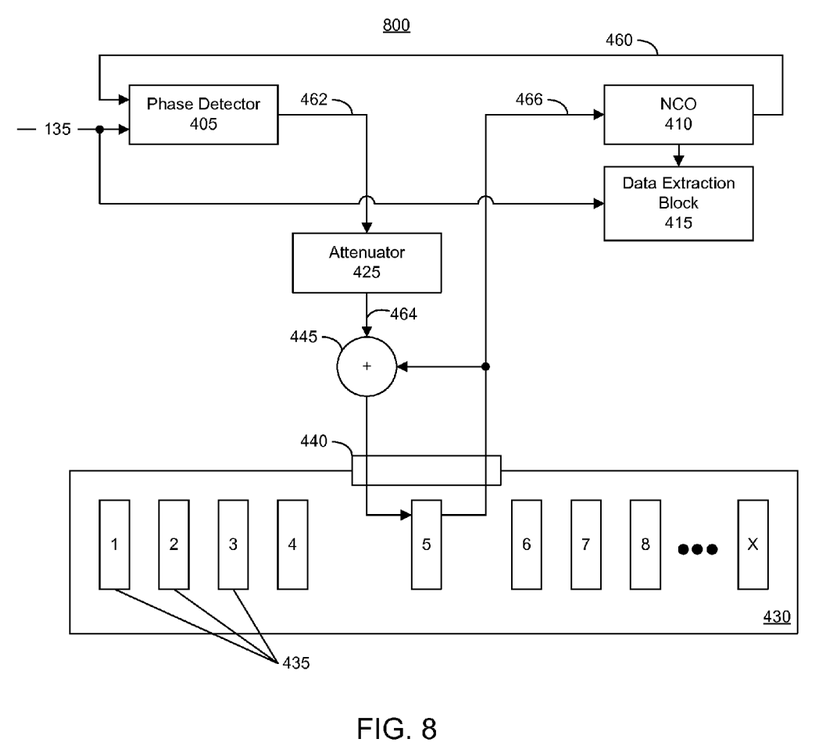
FIG. 8 is a third block diagram illustrating a system for burst phase detection in accordance with another embodiment disclosed within this specification.

FIG. 8 is a third block diagram illustrating a system 800 for burst phase detection in accordance with another embodiment disclosed within this specification. System 800 can be implemented substantially as described with reference to system 400 of FIG. 4. System 800, however, excludes adder 450. Accordingly, the sum of phase difference signal 462 and the value read from current memory cell 435_5 is not calculated. Rather, the value read from current memory cell 435_5 is provided directly to NCO 410 as second control signal 466.

System 800 illustrates an embodiment in which NCO 410 is phase corrected only by the phase profile stored in memory device 430. System 800, for example, utilizes phase information of the previous packets from the same transmitting unit, e.g., data from prior cycles for the same transmitting unit. By comparison, system 400 of FIG. 4 utilizes the phase information of the previous cycle in combination with packets of the current cycle from the same transmitting unit.

Figure 9:
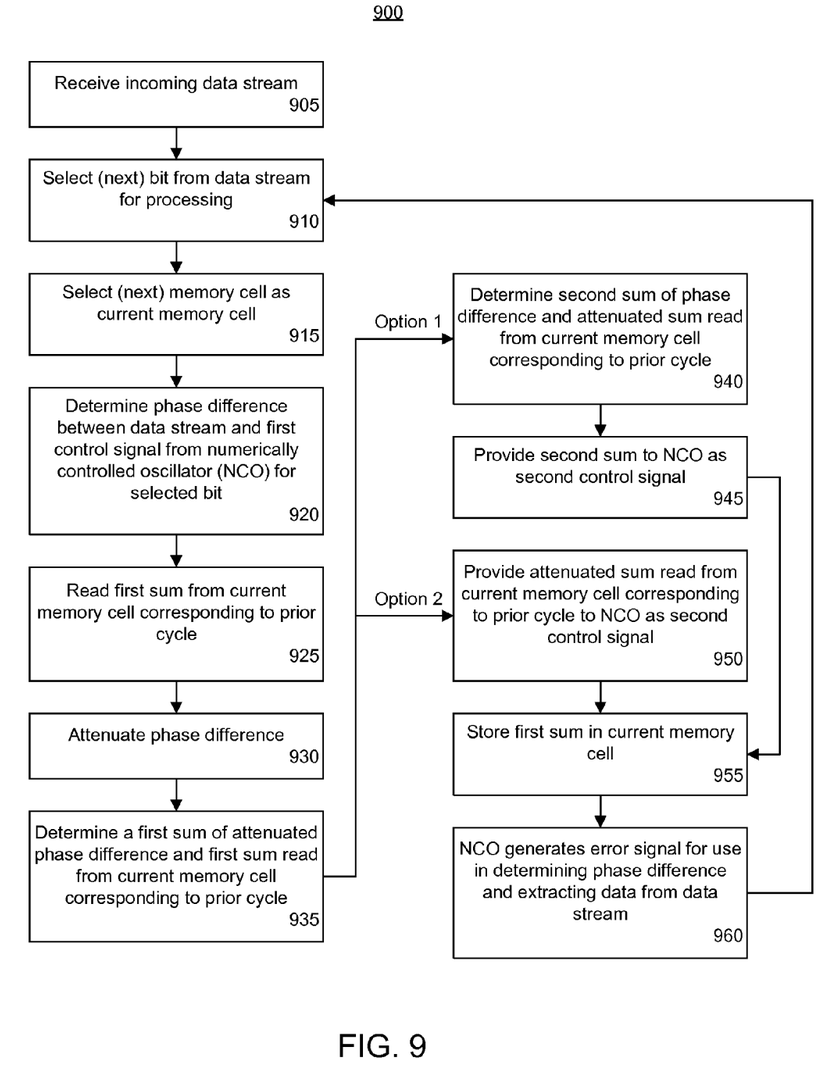
FIG. 9 is a flow chart illustrating a method of burst phase detection in accordance with another embodiment disclosed within this specification.

FIG. 9 is a flow chart illustrating a method 900 of burst phase detection in accordance with another embodiment disclosed within this specification. Method 900 illustrates the processing of a particular bit of a particular cycle of a received data stream. It should be appreciated that method 900 can be repeated for further bits across cycles as described with reference to FIGS. 1-8 of this specification.

Accordingly, method 900 can begin in step 905 where an incoming data stream is received within a receiving unit, e.g., within a phase detection system of the receiving unit. In step 910, a bit, or group of one or more bits, from the data stream can be selected for processing. For example, a first bit or group of bits can be selected. In subsequent iterations, a next bit or group of bits can be selected, e.g., a second, then third, then fourth, etc. Similarly, in step 915, a memory cell can be selected. In subsequent iterations, a next memory cell can be selected, e.g., a second, then third, then fourth, etc., with the system wrapping around from the last memory cell to the first between consecutive cycles. As noted, the bit or group of bits selected in step 910 and the particular memory cell selected as the current memory cell in step 915 can be determined according to the clock signal, e.g., particular cycle of the clock signal, that is synchronized with the data stream.

In step 920, the phase difference between the data stream and a first control signal output from an NCO, e.g., an error signal, can be determined for the selected bit. In step 925, a value can be read from the current memory cell. The value that is read can be a first sum corresponding to the last, or prior, cycle of the data stream. As noted, each memory cell, presuming no change in the number of transmitting units, stores values corresponding to the same transmitting unit from one cycle to another.

In step 930, the phase difference calculated between the first control signal and the data stream can be attenuated to generate an attenuated phase difference. In step 935, a first sum can be determined. The first sum calculated in step 935 can be a sum of the attenuated phase difference and the first sum that is read from the current memory cell. As discussed, the first sum read from the current memory cell is the first sum stored in the current memory cell from the last or prior cycle.

In an embodiment, method 900 can proceed to step 940, referred to as "option 1" in FIG. 9. In step 940, a second sum optionally can be determined. The second sum can be a sum of the phase difference and the first sum read from the current memory cell corresponding to the prior cycle. In step 945, the second sum can be provided to the NCO as a second control signal. As noted, the first control signal generated by the NCO is generated responsive to the second signal. After step 945, method 900, according to option 1, can continue to step 955.

In another embodiment, method 900 can proceed to step 950, referred to as "option 2" in FIG. 9. In step 950, the first sum read from the current memory cell that corresponds to the prior cycle can be provided to the NCO as the second control signal. After step 950, method 900 can proceed to step 955.

In step 955, the first sum can be stored in the current memory cell. The first sum is stored, thereby overwriting the value that was read in step 925 and referenced in steps 935, 940, and 950.

In step 955, the NCO can use the first control signal for use in determining the phase difference and extracting data from the data stream. As noted, the NCO can output the first control signal or another signal specifying phase information, to a circuit block that is configured to extract data from the received data stream.

One or more embodiments disclosed within this specification can be implemented using circuit blocks that can be implemented in the form of discrete components, as devices within an IC, or a combination of both. For example, one or more embodiments can be implemented within an IC that is programmable, whether fully or partially, or within an IC that is not programmable.

Some ICs can be programmed to perform specified functions. One example of an IC that can be programmed is a field programmable gate array (FPGA). An FPGA typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), PLLs, NCOs, and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic. In another example, a programmable IC can include an application-specific integrated circuit (ASIC) that includes at least some programmable circuitry, e.g., a hardware programmable structure.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

The figures illustrate the architecture, functionality, and operation of possible implementations of systems, methods and computer program products according to one or more embodiments disclosed within this specification. In this regard, each block can represent a module, segment, or portion of code, which includes one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block, and combinations of blocks, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a data storage medium, e.g., a non-transitory computer-usable or computer-readable medium, storing program code that, when loaded and executed in a system comprising memory and a processor, causes the system to perform at least a portion of the functions described within this specification. In another example, the device can include program code that, when loaded into a programmable IC, physically implements circuitry configured to perform at least a portion of the functions described within this specification. Examples of data storage media can include, but are not limited to, optical media, magnetic media, magneto-optical media, computer memory such as random access memory, a bulk storage device, e.g., hard disk, or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A phase detection system, the system comprising:
a phase detector configured to determine a phase difference between a data stream and a first control signal;
a numerically controlled oscillator configured to generate the first control signal responsive to a second control signal;
a memory device comprising a plurality of memory cells correlated with a cycle of the data stream, wherein the memory device is configured to increment a current memory cell of the plurality of memory cells according to a clock signal synchronized with the data stream;
an attenuator configured to attenuate the phase difference and generate an attenuated phase difference; and
a first adder coupled to the memory device, wherein the first adder is configured to generate a first sum of the attenuated phase difference and a value read from the current memory cell according to the clock signal synchronized with the data stream, wherein the first adder is configured to store the first sum in the current memory cell.

2. The phase detection system of claim 1, further comprising:
a second adder configured to determine a second sum of the value read from the current memory cell and the phase difference, and
wherein the second adder is configured to provide the second sum to the numerically controlled oscillator as the second control signal.

3. The phase detection system of claim 1, wherein the value read from the current memory cell is provided to the numerically controlled oscillator as the second control signal.

4. The phase detection system of claim 1, wherein the first sum stored in each of the plurality of memory cells forms a phase profile for a plurality of transmitting units sending data in the data stream.

5. The phase detection system of claim 1, wherein the data stream comprises a portion of data sent from each of a plurality of transmitting units, and
wherein each portion of data has a unique phase that is correlated with the particular one of the plurality of transmitting units that sent the portion of data.

6. The phase detection system of claim 1, wherein the value read from the current memory cell is a first sum generated during a prior cycle and corresponds to a same transmitting unit during a subsequent cycle.

7. The phase detection system of claim 6, wherein the first sum is stored in the current memory cell and overwrites the first sum from the prior cycle.

8. A method of phase detection, the method comprising:
determining a phase difference between a data stream and a control signal;
attenuating the phase difference generating an attenuated phase difference;
determining a current sum of a value read from a current memory cell of a plurality of memory cells and the attenuated phase difference;
controlling a numerically controlled oscillator configured to generate the control signal responsive to the value read from the current memory cell; and
storing the current sum in the current memory cell.

9. The method of claim 8, further comprising:
incrementing the memory cell according to a clock signal synchronized with the data stream.

10. The method of claim 8, further comprising:
controlling the numerically controlled oscillator according to a signal generated by summing the value read from the current memory cell with the phase difference.

11. The method of claim 8, further comprising:
controlling the numerically controlled oscillator directly responsive to the value read from the current memory cell.

12. The method of claim 8, wherein the data stream comprises a portion of data sent from each of a plurality of transmitting units, and
wherein each portion of data has a unique phase that is correlated with the particular one of the plurality of transmitting units that sent the portion of data.

13. The method of claim 12, further comprising:
for each cycle of the clock signal, storing a current sum of the attenuated phase difference and a value read from a memory cell correlated with the cycle of the clock signal within the memory cell correlated with the cycle of the clock signal, thereby generating a phase profile for the plurality of transmitting units.

14. The method of claim 8, wherein the value read from the current memory cell that is used to determine the current sum is a prior sum from a prior cycle corresponding to a portion of the cycle associated with a same transmitting unit as the current sum.

15. The method of claim 8, further comprising:
storing the current sum in the current memory cell and overwriting the prior sum from the prior cycle.

16. A device comprising:
a non-transitory data storage medium usable by a system comprising a processor and a memory, wherein the data storage medium stores program code that, when executed by the system, causes the system to perform phase detection, the data storage medium comprising:

computer-usable program code configured to determine a phase difference between a data stream and a control signal;

computer-usable program code configured to attenuate the phase difference generating an attenuated phase difference;

computer-usable program code configured to determine a current sum of a value read from a current memory cell of a plurality of memory cells and the attenuated phase difference;

computer-usable program code configured to control a numerically controlled oscillator configured to generate the control signal responsive to the value read from the current memory cell; and computer-usable program code configured to store the current sum in the current memory cell.

17. The device of claim 16, further comprising:

computer-usable program code configured to increment the memory cell according to a clock signal synchronized with the data stream.

18. The device of claim 16, further comprising:

computer-usable program code configured to control the numerically controlled oscillator according to a result of summing the value read from the current memory cell with the phase difference.

19. The device of claim 16, further comprising:

computer-usable program code configured to control the numerically controlled oscillator directly responsive to the value read from the current memory cell.

20. The device of claim 16, wherein the value read from the current memory cell that is used to determine the current sum is a prior sum from a prior cycle corresponding to a portion of the cycle associated with a same transmitting unit as the current sum.

* * * * *